(12) United States Patent
Swart et al.

(10) Patent No.: US 8,105,119 B2
(45) Date of Patent: Jan. 31, 2012

(54) FLAT PLUNGER ROUND BARREL TEST PROBE

(75) Inventors: Mark A. Swart, Villa Park, CA (US); Steve B. Sargeant, Anaheim Hills, CA (US); Charles J. Johnston, Chino Hills, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 12/683,346

(22) Filed: Jan. 6, 2010

(65) Prior Publication Data

US 2010/0197176 A1 Aug. 5, 2010

Related U.S. Application Data

(60) Provisional application No. 61/148,657, filed on Jan. 30, 2009.

(51) Int. Cl.
*H01R 11/22* (2006.01)

(52) U.S. Cl. ...................................................... 439/816

(58) Field of Classification Search .................. 439/816, 439/482, 824, 700, 73, 69; 324/754–755, 324/761
See application file for complete search history.

(56) References Cited

U.S. PATENT DOCUMENTS

| | | | | |
|---|---|---|---|---|
| 4,246,902 A * | 1/1981 | Martinez | ........................ | 604/22 |
| 4,508,405 A * | 4/1985 | Damon et al. | ................ | 439/260 |
| 5,009,613 A | 4/1991 | Langgard et al. | | |
| 5,154,628 A * | 10/1992 | Skegin | ........................... | 439/336 |
| 5,159,265 A * | 10/1992 | Alfonso et al. | ................ | 324/761 |
| 5,174,763 A * | 12/1992 | Wilson | ........................... | 439/66 |
| 5,225,773 A * | 7/1993 | Richards | ........................ | 324/754 |
| 5,447,442 A | 9/1995 | Swart | | |
| 5,744,977 A | 4/1998 | Cuautla | | |
| 6,043,666 A | 3/2000 | Kazama | | |
| 6,255,834 B1 * | 7/2001 | Smith | ........................... | 324/755 |
| 6,271,672 B1 | 8/2001 | Swart et al. | | |
| 6,506,082 B1 * | 1/2003 | Meek et al. | ................... | 439/700 |
| 6,821,131 B2 * | 11/2004 | Suzuki et al. | ................... | 439/73 |
| 7,021,957 B2 * | 4/2006 | Sweetland et al. | ........... | 439/405 |
| 7,154,286 B1 * | 12/2006 | Marx et al. | ..................... | 324/761 |
| 7,362,114 B2 * | 4/2008 | Winter et al. | ................. | 324/755 |
| 7,446,548 B2 * | 11/2008 | Chen | ............................. | 324/761 |
| 7,545,159 B2 * | 6/2009 | Winter | .......................... | 324/761 |
| 2008/0143367 A1 | 6/2008 | Chabineau-Lovgren | | |

FOREIGN PATENT DOCUMENTS

KR 10-2008-0073841 8/2008

OTHER PUBLICATIONS

International Search Report and Written Opinion for Application No. PCT/US2010/021252; date mailed Mar. 24, 2010; search and opinion completed Mar. 1, 2010; 8 pages.
Korean Patent Abstract Publication No. 1020080073841; Date of Publication Aug. 12, 2008, corresponding to Korean Patent Application No. 1020070012545.

* cited by examiner

*Primary Examiner* — Jean F Duverne
(74) *Attorney, Agent, or Firm* — Christie, Parker & Hale, LLP

(57) ABSTRACT

A spring probe utilizing a flat plunger and a round barrel having a compression spring positioned within the barrel and a wiper for internal contact between the plunger and the inside of the barrel.

21 Claims, 6 Drawing Sheets

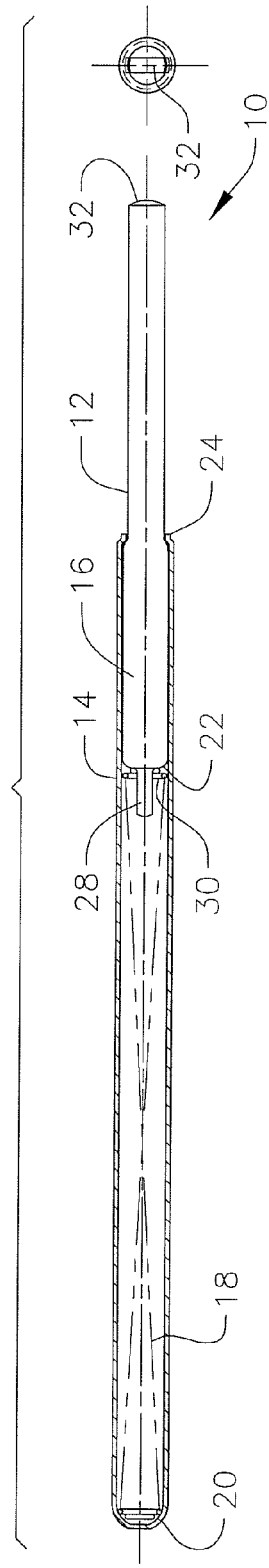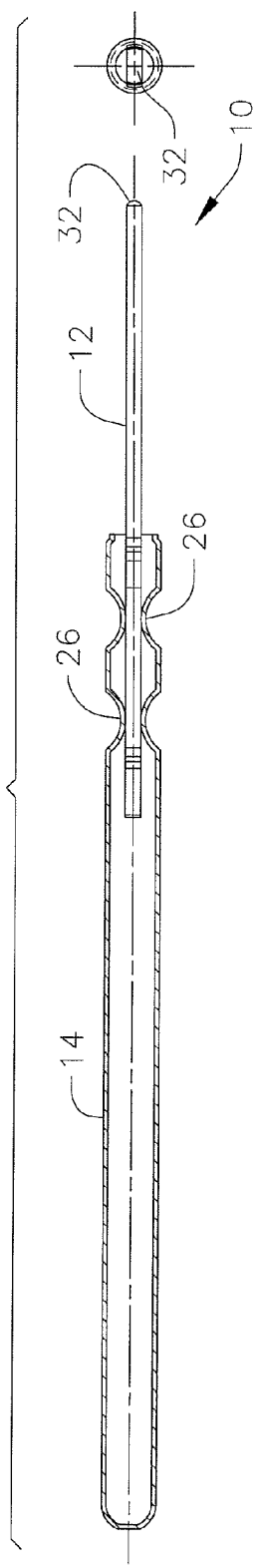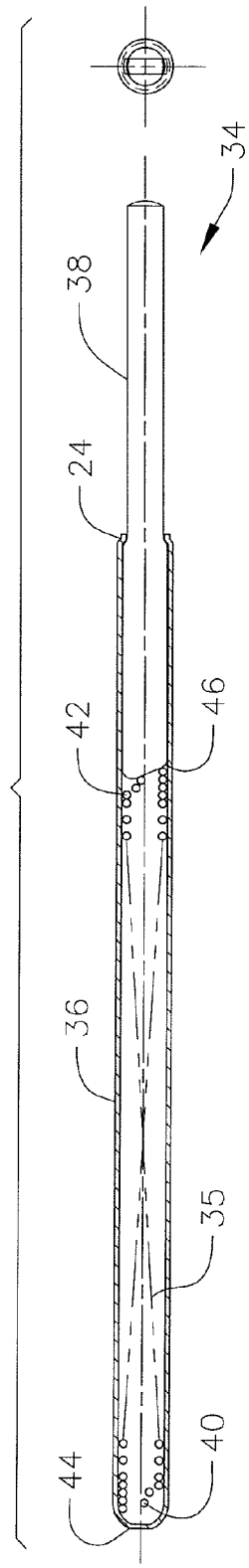

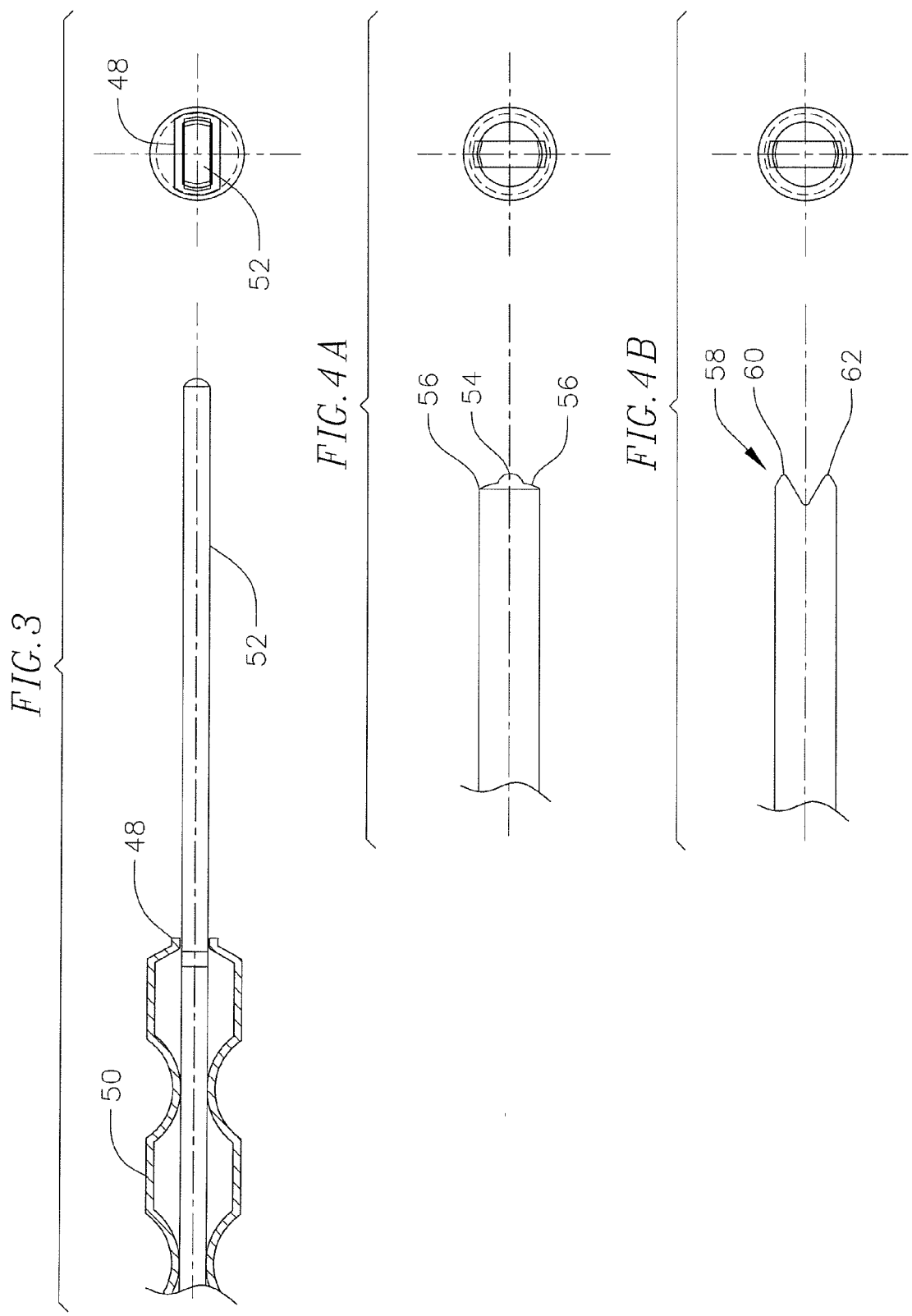

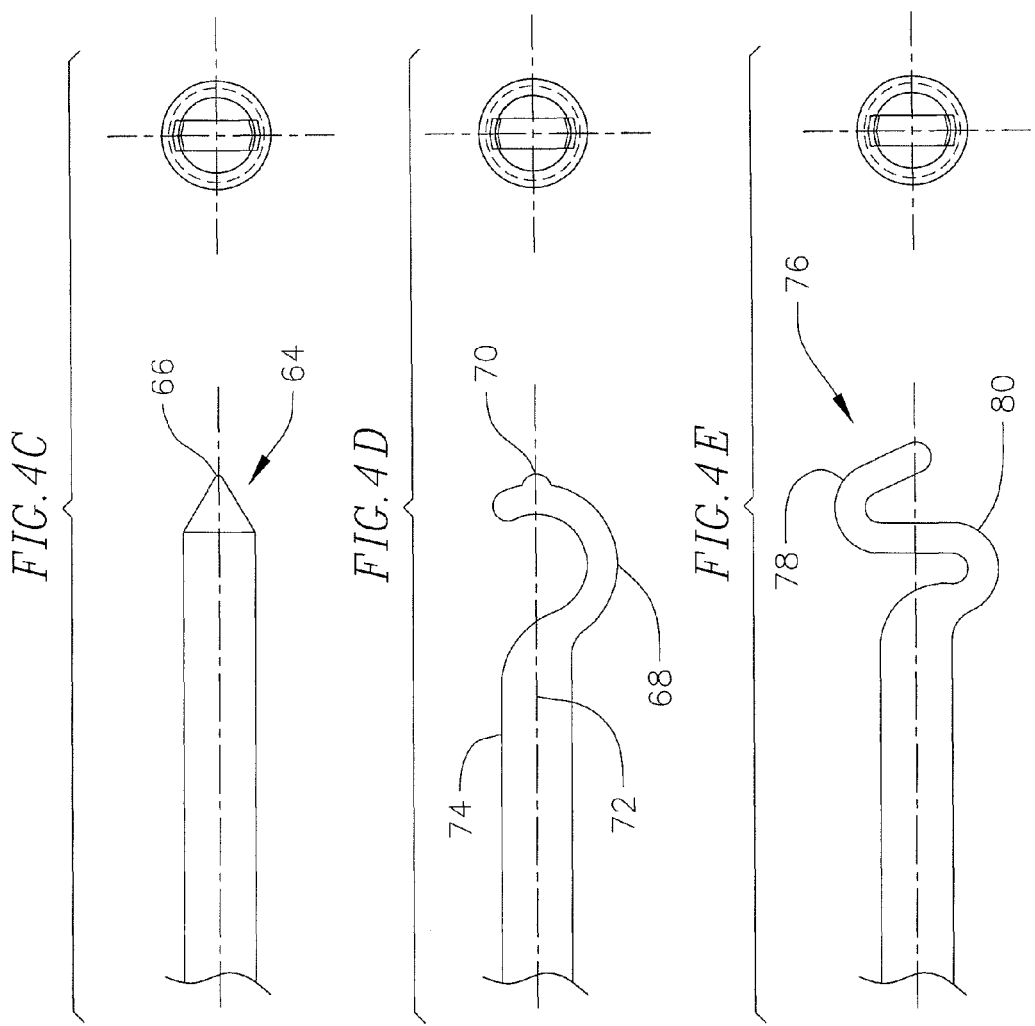

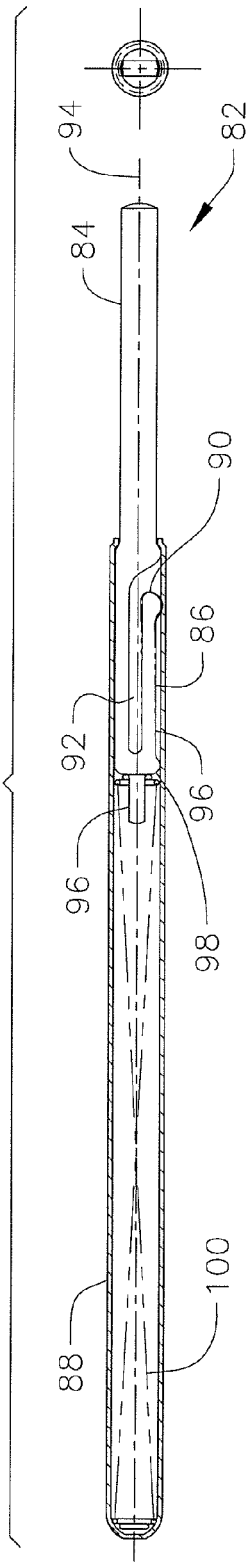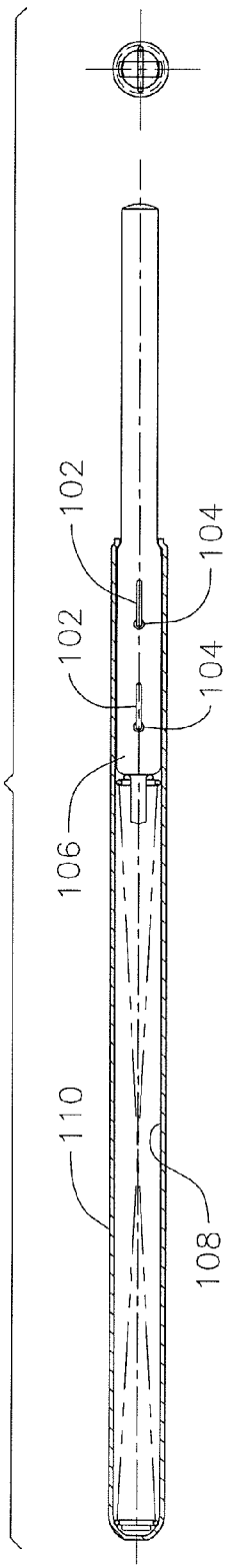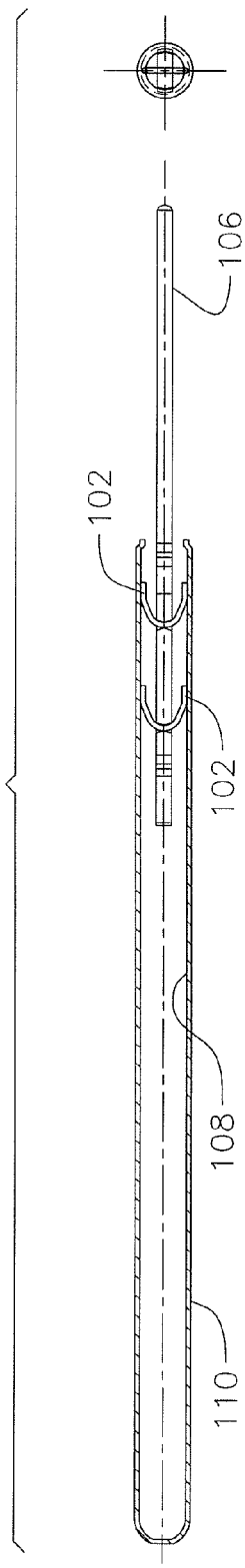

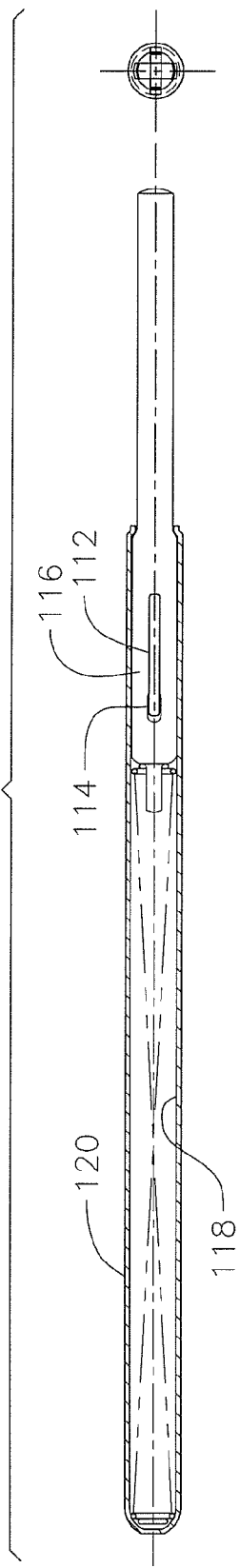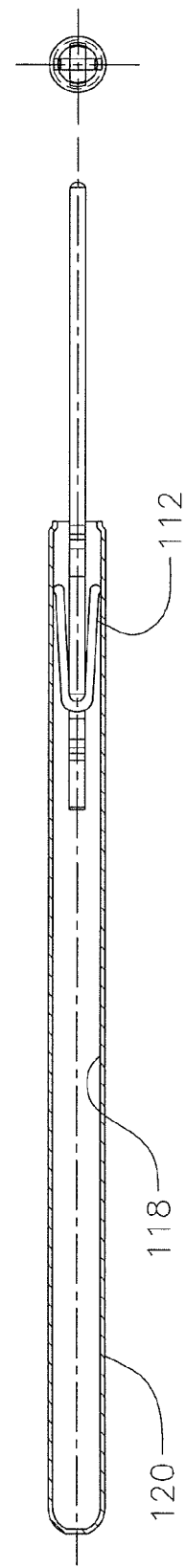

FLAT PLUNGER ROUND BARREL TEST PROBE

CROSS-REFERENCE TO RELATED APPLICATION(S)

This application claims priority to U.S. Provisional Application No. 61/148,657 filed Jan. 30, 2009.

FIELD OF THE INVENTION

The present invention relates to electrical contact probes forming electrical interconnects and, more particularly, to contact probes having a flat plunger and a round barrel.

BACKGROUND OF THE INVENTION

Conventional spring loaded contact probes generally include a movable round plunger and a tubular barrel having an open end for containing an enlarged diameter section of the plunger, and a spring for biasing the travel of the plunger in the barrel. The plunger bearing slidably engages the inner surface of the barrel. The enlarged bearing section is retained in the barrel by a crimp near the barrel open end. The plunger is commonly biased outwardly, a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tips form an electrical interconnect between the electrical device under test and test equipment and as such, are manufactured from an electrically conductive material. Typically the probes are fitted into cavities formed through the thickness of a test plate or socket. Generally a contact side of the electrical device to be tested, such as an integrated circuit, is brought into pressure contact with the tips of the plungers protruding through one side of the test plate or test socket for manufacturing spring pressure against the electrical device. A contact plate connected to the test equipment is brought to contact with the tips of the plungers protruding from the other side of the test plate or test socket. The test equipment transmits signals to the contact plate from where they are transmitted through the test probe interconnects to the device being tested. After the electrical device has been tested, the pressure exerted by the spring probes is released and the device is removed from contact with the tip of each probe.

The process of making conventional spring probes involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

An important aspect of testing integrated circuits is that they are tested under high frequencies. As such impedance matching is required between the test equipment and the integrated circuit so as to avoid attenuation of the high frequency signals. Considering that spacing within a test socket is minimal, in order to avoid attenuation of the high frequency signals, the length of the electrical interconnect formed by the probes must be kept to a minimum. To address this problem external spring probes have been developed having a shorter length than conventional probes. External spring probes consist of two separate sections each having a tip and a flange. A contact component extends from each probe section opposite the tip. The two contact components contact each other and the spring is sandwiched between two flanges that surround the contact components. Typically the first contact component is a barrel while the second contact component is a bearing surface. The bearing surface is slidably engaged to the inner surface of the barrel. These probes are fitted into cavities formed in the test sockets used during testing. A problem associated with these type of external spring probes is the expense to manufacture due to costly machining operations.

In response thereto external spring probes were designed having flat components which can be produced less expensively by stamping. Typically these designs incorporate two components which are connected orthogonally and the electrical path between the two components is through a protruding end surface. A problem with this design is that the components wear out rather quickly and have a short life span requiring constant replacement.

Non-orthogonally connected external spring contact assemblies have two movable and linearly overlapping contact members or plungers surrounded by an external spring. Each plunger has a contact portion and a tail portion wherein the tail portion has a flat surface that passes over and makes contact with an opposing flat plunger tail portion inside the spring when assembled. The spring has end coils that press onto each of the opposing plungers to prevent the plungers from separating from the spring, thus fixing the plunger contact portion and the tail portions with respect to each end of the spring. Utilizing the natural torsional movement of the spring while it is compressed, the flat surfaces of the plunger tail portions maintain contact throughout the compression stroke of the contact assembly. The contact between the opposing flat sections prevents the twisting or torsional movement of the spring from translating to the tips on the contact portions. The opposition to the natural twisting enhances the electrical conductivity of the components, which in turn improves performance of the spring contact assembly. The spring can also have reduced diameter coil sections along the length of the spring to further constrain the plunger tails and enhance the interaction between the two plungers, or further biasing effect can be created by adding an offset coil section in the spring.

Each of the plungers formed in a generally cylindrical shape are by lathe, screw machine or other similar manufacturing equipment. Plungers formed in a generally flat shape are by stamping, etching, photolithography or other similar manufacturing technique for creating substantially two dimensional geometries.

Each of round probes and flat probe configurations have their advantages and disadvantages. Consequently there is a need for a hybrid probe which combines the advantages of the two style probes.

SUMMARY OF THE INVENTION

The present invention is directed to a spring contact assembly having a flat plunger, a cylindrical barrel and a compression spring wherein the plunger has a biasing feature to improve contact with the barrel. The contact tip can have a number of configurations including a bologna cut tip. A micro-wiper feature can be added to the plunger, the barrel or as an additional component to improve the internal contact between the plunger and the barrel. The spring has end coils that assist in biasing the plunger within the barrel.

The barrel is formed in a general cylindrical shape suitable for lathe, screw machine or deep draw manufacturing equipment. The plunger is formed in a generally flat shape, suitable for stamping, etching, laser-cutting, electroforming, microcasting, photolithography or other similar manufacturing technique for creating substantially two-dimensional geometries. The contact tip incorporated into a flat plunger can be bologna style meaning curved from side to side and from top to bottom, have a contact nib, forked design, pointed or have a single or double micro-spring. The micro-wiper on the plunger is a slot cut into the side of the plunger to create a flexible flange which engages the barrel. The additional micro-wiper component could be a wire, spring, clip or other insert.

These and other aspects of the present invention will be more fully understood with reference to the detailed description in combination with the drawings.

BRIEF DESCRIPTION OF THE DRAWINGS

FIG. 1A is a cross-sectional view of a spring contact assembly of the present invention;

FIG. 1B is another cross-sectional view of the spring contact assembly of FIG. 1;

FIG. 2 is a cross-sectional view of an alternative spring contact assembly of the present invention;

FIG. 3 is a cross-sectional view of another alternative embodiment spring contact assembly of the present invention;

FIG. 4A is a detail view of an alternative contact tip design of the spring contact assembly of FIG. 1A;

FIG. 4B is a detail view of another alternative contact tip design;

FIG. 4C is a detail view of another alternative contact tip design;

FIG. 4D is a detail view of another alternative contact tip design;

FIG. 4E is a detail view of another alternative contact tip design;

FIG. 5 is a cross-sectional view of another alternative spring contact assembly of the present invention;

FIG. 6A is a cross-sectional view of another alternative embodiment spring contact assembly of the present invention;

FIG. 6B is another cross-sectional view of the spring contact assembly of FIG. 6A;

FIG. 7A is a cross-sectional view of another alternative embodiment spring contact assembly of the present invention;

FIG. 7B is another cross-sectional view of the spring contact assembly of FIG. 7A;

DETAILED DESCRIPTION OF THE INVENTION

Figure 8A:
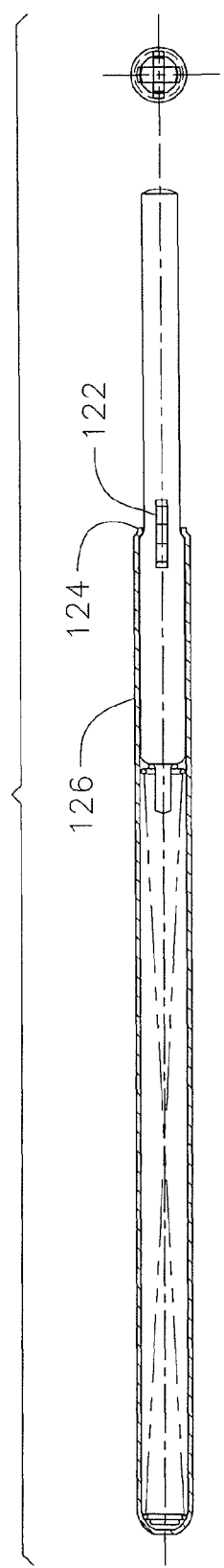
FIG. 8A is a cross-sectional view of another alternative embodiment spring contact assembly of the present invention.

FIGS. 1A and 1B illustrate an exemplary spring contact assembly 10 of the present invention. The spring contact assembly 10 includes a plunger 12 partially positioned within a barrel 14. The plunger 12 has a flat configuration and has a wider portion 16 which is retained within the tubular barrel 14. A round compression spring 18 is positioned within the tubular barrel between a closed end 20 of the barrel and end 22 of wider portion 16 of the plunger. The wider portion 16 of the plunger slidably engages the inner surface of the barrel. The wider bearing portion is retained in the barrel by a crimp or close 24 on an end of the barrel opposite end 20. Crimp 24 defines an opening for the plunger to extend out of and be compressed into the barrel. The plunger 12 is normally biased outwardly a selected distance by the spring and may be depressed inwardly into the barrel under force directed against the spring.

As shown in FIG. 1B, the barrel can have a plurality of guiding crimps to 26 along a portion of the barrel to assist in guiding the plunger 12 as it is being compressed into the barrel. The plunger 12 can have a spring tang 28 positioned on the end of the plunger for receipt of end coils 30. On the opposite end of the plunger is a contact tip 32 which has a rounded surface in both the horizontal and vertical directions. The rounded surface typically requires a second machining operation to produce the round surface in both the X and Y directions. Contact tip 32 having rounded surfaces in both the X and Y direction is referred to as a "bologna" cut tip.

FIG. 2 illustrates an alternative hybrid spring probe 34 which is similar to spring probe 10 with the exception that a biasing round spring 35 is positioned within the cylindrical barrel 36 adjacent flat plunger 38. Spring 35 has decreasingly smaller end coil sections 40 and 42 which when pressed against end 44 of barrel 36 and against angled end surface 46 of plunger 38 provide a lateral or sideways biasing force against the plunger to improve electrical contact between the plunger and the barrel. As with FIG. 1, barrel 36 includes a round close or crimp 24 for retaining the barrel within the plunger. Alternatively, the spring contact assemblies shown if FIGS. 1A and 1B and FIG. 2 can include an alternative means for compression in lieu of compression springs 18 or 35.

The means for compression can come from the plunger itself which includes a plurality of serpentine deflection beams extending from the wider portion 16 of the plunger to the closed end 20 of the barrel. The details of the serpentine deflection beams is illustrated in Applicant's U.S. Pat. No. 5,865,641, the disclosure of which is incorporated herein by reference.

FIG. 3 is a detail view illustrating an alternative close 48 for the end of the barrel 50 which is a square configuration matching the flat configuration of plunger 52. Square crimp or close 48 improves guidance of the plunger into and out of the barrel and improved internal contact of the barrel with the plunger.

FIGS. 1 through 3 illustrate the bologna style tip configuration, however, other tip configurations are contemplated wherein FIG. 4A illustrates a bologna style tip 54 with a dimple 56 on either side of the tip wherein the outer portions are removed. FIG. 4B illustrates a forked tip 58 wherein the center portion of the tip is removed thereby creating two contact points 60 and 62 for the plunger. FIG. 4C illustrates a bologna cut contact tip 64 which has been modified to provide a sharp point tip 66. FIG. 4D illustrates a micro-spring tip 68 to provide flexibility for the tip and can have a contact nib 70 located on the micro-spring 68 along center line 72 of plunger 74. FIG. 4E illustrates a double micro-spring tip 76 having a first spring section 78 and the second spring section 80. Double micro-spring tip 76 provides further flexibility of the contact tip for contacting test locations. Although various contact tip styles have been illustrated herein, it is to be understood that further geometries are contemplated by the present invention.

FIG. 5 illustrates another alternative spring contact assembly 82 of the present invention wherein the plunger 84 includes a biasing wiper 86 for improving electrical contact with barrel 88. Biasing wiper 86 is essentially a flange having an enlarged head portion 90 formed by cutting a channel or groove 92 along the center line 94 of the plunger and removing an outer portion 96 of the flange to create the enlarged head. The channel or groove 92 allows flexing of the flange 86 and the enlarged head portion 90 to improve contact with the internal surface of the barrel during compression of the plunger. The various features of the plunger shown in the figures can be incorporated into any of the plunger configurations, for example, the barrel in FIG. 5 illustrates a spring tang 96 for retention of the end coils 98 of compression spring 100, however, the end of the plunger can have an angled surface instead of a spring tang as shown in FIG. 2. Barrel guiding cramps, round or square end closes and any of the illustrated contact tip configurations can be included in the spring probe configuration 82.

Figure 8B:
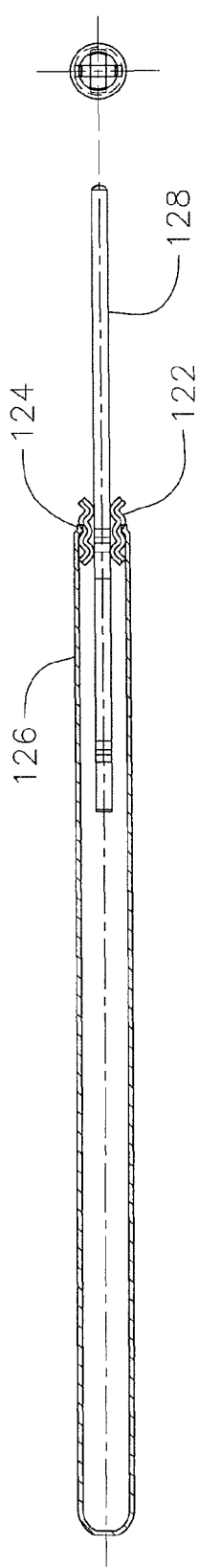
FIG. 8B is another cross-sectional view of the spring contact assembly of FIG. 8A.

Additional methods of improving electrical contact between the barrel and the plunger are illustrated in FIGS. 6 through 8. Specifically FIGS. 6A and 6B illustrate an inserted formed wire wiper 102 which essentially is a "U" shaped wire positioned through holes 104 in plunger 106 which are sized and dimensioned to engage the internal surface 108 of barrel 110. The wire wipers 102 also assist in guiding the plunger 106 within the barrel 110 and ensure electrical contact between the plunger and the barrel. FIGS. 7A and 7B illustrate a clip wiper 112 which is a "V" shaped clip passing through a hole 114 in the plunger 116 engaging the inside surface 118 of barrel 120 similar to wire wipers 102. Clip wiper 112 guides the plunger 116 within the barrel 120 and ensures electrical contact between the components. Wire wiper 102 and clip wiper 112 move inside the barrel with the plunger whereas FIGS. 8A and 8B illustrate a spring wiper 122 which is stationary and is inserted into the open end 124 of barrel 126 adjacent to and engaging plunger 128. Spring wiper 124 guides the plunger during compression into the barrel and ensures good electrical contact between the two components.

Although the present invention has been described and illustrated with respect to several embodiments thereof, it is to be understood that the invention is not to be so limited and that changes and modifications can be made herein which are within the full intended scope of the invention as hereinafter claimed.

What is claimed is:

1. A compliant contact assembly comprising:
   a non-cylindrical flat plunger;
   a cylindrical barrel for receipt of at least a portion of the plunger; and
   means for biasing the plunger within the barrel;
   wherein a largest cross-sectional area of the plunger occupies a maximum of 72% of a largest cross-sectional area of the barrel as defined by an internal diameter of the barrel.

2. The assembly of claim 1 wherein the means for biasing the plunger within the barrel is a compression spring.

3. The assembly of claim 2 wherein the means for biasing the plunger further comprises an angled surface on an end of the plunger within the barrel.

4. The assembly of claim 3 wherein the compression spring has smaller diameter end coils.

5. The assembly of claim 1 wherein the barrel has at least one guiding crimp along a length of the barrel to guide the plunger into the barrel during compression of the contact assembly.

6. The assembly of claim 1 wherein the barrel has a square close on an end of the barrel adjacent the plunger.

7. The assembly of claim 1 wherein the plunger has a curved contact tip in both the lateral and longitudinal directions.

8. The assembly of claim 1 wherein the plunger has a dimpled contact tip.

9. The assembly of claim 1 wherein the plunger has a forked contact tip.

10. The assembly of claim 7 wherein the contact tip is pointed.

11. The assembly of claim 1 wherein the plunger has a micro-spring contact tip.

12. The assembly of claim 1 wherein the means for biasing the plunger is a wiper formed on the plunger at a location within the barrel.

13. The assembly of claim 1 wherein the means for biasing the plunger is at least one wire wiper attached to the plunger within the barrel.

14. The assembly of claim 1 wherein the means for biasing the plunger is at least one clip wiper attached to the plunger within the barrel.

15. The assembly of claim 1 wherein the means for biasing the plunger is a spring wiper positioned in an end of the barrel around the plunger.

16. A spring probe comprising:
    a flat contact member substantially flat along an entire length of the flat contact member;
    a cylindrical barrel for receipt of at least a portion of the flat contact member;
    first means for biasing the flat contact member within the barrel; and
    second means for biasing the portion of the flat contact member within the barrel against the barrel.

17. The probe of claim 16 wherein the first means for biasing the flat contact member within the barrel is a compression spring.

18. The probe of claim 16 wherein the second means for biasing the flat contact member against the barrel is a wiper formed on the flat contact member at a location within the barrel.

19. The probe of claim 16 wherein the second means for biasing the flat contact member against the barrel is a wiper attached to the flat contact member within the barrel.

20. The probe of claim 16 wherein the second means for biasing the flat contact member against the barrel is a wiper positioned on an end of the barrel adjacent the flat contact member.

21. The probe of claim 16 wherein the first means for biasing the flat contact member within the barrel is a plurality of serpentine deflection beams on the flat contact member within the cylindrical barrel.

* * * * *